(12) United States Patent
Nagao et al.

(10) Patent No.: US 10,622,349 B2
(45) Date of Patent: Apr. 14, 2020

(54) SEMICONDUCTOR DEVICE

(71) Applicant: Rohm Co., Ltd., Kyoto (JP)

(72) Inventors: Kei Nagao, Kyoto (JP); Toru Takahashi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 268 days.

(21) Appl. No.: 15/660,438

(22) Filed: Jul. 26, 2017

(65) Prior Publication Data

US 2018/0033785 A1 Feb. 1, 2018

(30) Foreign Application Priority Data

Jul. 27, 2016 (JP) ................. 2016-147392

(51) Int. Cl.
| | |
|---|---|
| H02H 9/02 | (2006.01) |
| H01L 27/02 | (2006.01) |
| H02H 3/20 | (2006.01) |
| H05B 33/08 | (2020.01) |
| B60Q 11/00 | (2006.01) |
| H03K 17/0812 | (2006.01) |
| H02H 9/04 | (2006.01) |

(52) U.S. Cl.
CPC ........ *H01L 27/0266* (2013.01); *B60Q 11/005* (2013.01); *H01L 27/0255* (2013.01); *H02H 3/20* (2013.01); *H03K 17/0812* (2013.01); *H05B 33/089* (2013.01); *H02H 9/02* (2013.01); *H02H 9/04* (2013.01); *H02H 9/042* (2013.01)

(58) Field of Classification Search
USPC ................................. 361/91.1, 111
See application file for complete search history.

(56) References Cited

U.S. PATENT DOCUMENTS

| | | | | |
|---|---|---|---|---|
| 2006/0164770 A1* | 7/2006 | Inaba | ..................... | H02H 9/042 361/91.1 |
| 2006/0170287 A1* | 8/2006 | Ito | ........................ | B60Q 11/005 307/10.1 |
| 2009/0146631 A1* | 6/2009 | Fukumori | ........... | H02M 3/1588 323/284 |
| 2012/0286756 A1* | 11/2012 | Tsukiji | .................... | H02M 1/32 323/284 |
| 2014/0354159 A1* | 12/2014 | Zhang | ................ | H05B 33/0815 315/127 |

FOREIGN PATENT DOCUMENTS

JP 2013-074679 4/2013

* cited by examiner

*Primary Examiner* — Danny Nguyen
(74) *Attorney, Agent, or Firm* — Fish & Richardson P.C.

(57) ABSTRACT

A semiconductor device includes a first overvoltage detection unit including a first comparator arranged to output a first detection signal based on a first divided voltage after dividing an output voltage of a power supply circuit by first resistors disposed externally and a second overvoltage detection unit including second resistors and a second comparator arranged to output a second detection signal based on a second divided voltage after dividing the output voltage by the second resistors.

14 Claims, 6 Drawing Sheets

SEMICONDUCTOR DEVICE

CROSS-REFERENCE TO RELATED APPLICATIONS

This nonprovisional application claims priority under 35 U.S.C. § 119(a) on Patent Application No. 2016-147392 filed in Japan on Jul. 27, 2016, the entire contents of which are hereby incorporated by reference.

BACKGROUND OF THE INVENTION

Field of the Invention

The present invention relates to a semiconductor device arranged to detect overvoltage.

Description of Related Art

Conventionally, a switching driver, which is used in a switching power supply circuit arranged to drive various loads including a light emitting element such as a light emitting diode (LED), is provided as a semiconductor device (IC). Many of the semiconductor devices have an overvoltage protection function of detecting overvoltage of an output voltage of the switching power supply circuit so as to protect the same.

In the semiconductor device having the overvoltage protection function described above, a voltage after dividing the output voltage by external resistors is usually input to a comparator inside the semiconductor device, so as to detect overvoltage.

Note that an example of a conventional technique related to the above description is disclosed in JP-A-2013-74679.

However, the conventional structure has a problem that overvoltage cannot be detected when the external resistors that divide the output voltage is disconnected. In addition, set resistance values of the external resistors may be mistaken, and a set value of the overvoltage may exceed the withstand voltage of the semiconductor device. In these cases, the output voltage may exceeds the withstand voltage of the semiconductor device, and the semiconductor device may be broken.

SUMMARY OF THE INVENTION

In view of the above-mentioned problem, it is an object of the present invention to provide a semiconductor device that can prevent breakdown of the semiconductor device even if an abnormality occurs in the external resistors used for detecting overvoltage.

A semiconductor device according to one aspect of the present invention includes a first overvoltage detection unit including a first comparator arranged to output a first detection signal based on a first divided voltage after dividing an output voltage of a power supply circuit by first resistors disposed externally, and a second overvoltage detection unit including second resistors and a second comparator arranged to output a second detection signal based on a second divided voltage after dividing the output voltage by the second resistors.

DETAILED DESCRIPTION OF THE PREFERRED EMBODIMENTS

Hereinafter, an embodiment of the present invention is described with reference to the drawings. Here, a switching power supply circuit arranged to drive an LED as an example of a light emitting element is exemplified and described.

<Entire Configuration of Switching Power Supply Circuit>

Figure 1:
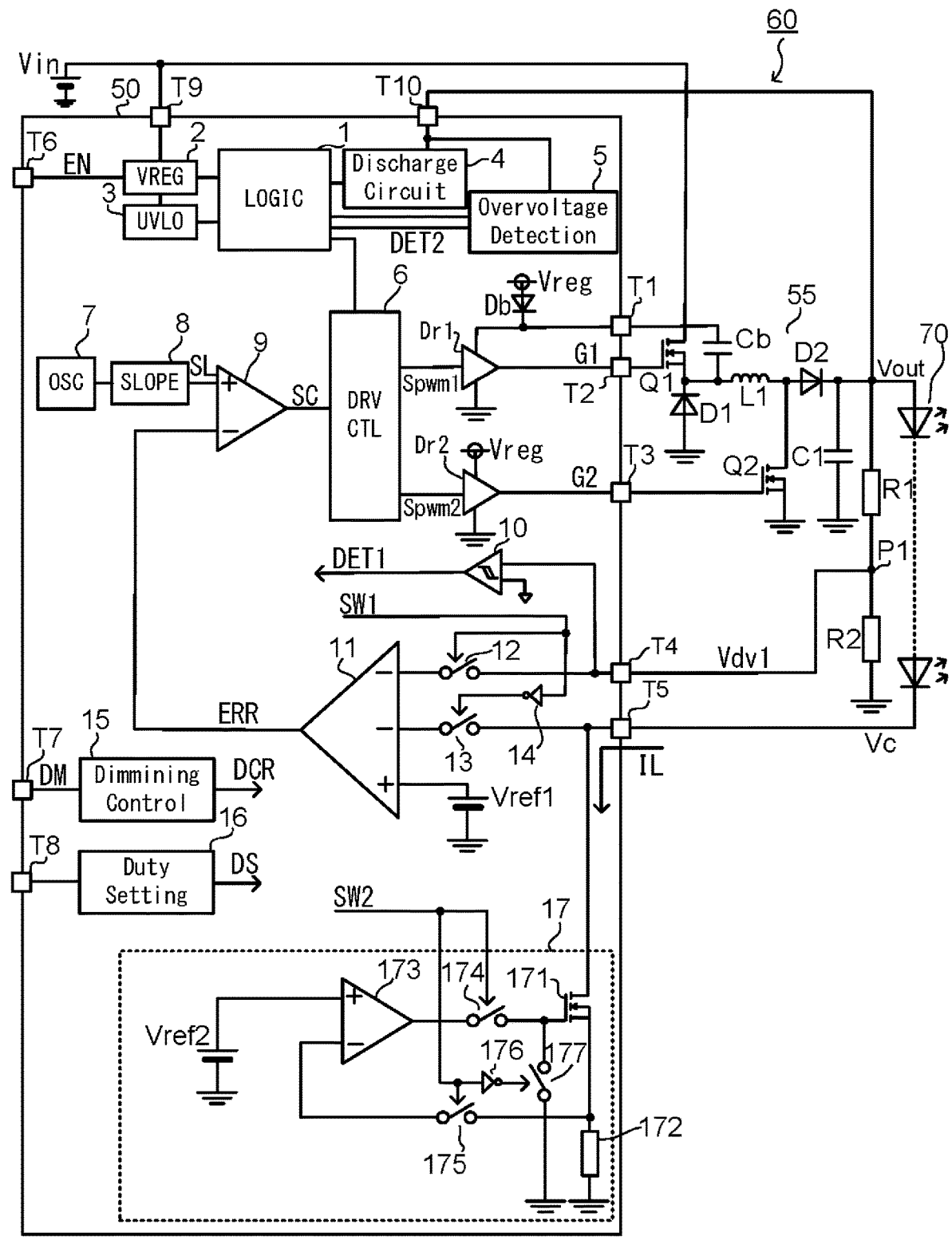
FIG. 1 is a diagram illustrating the entire configuration of a switching power supply circuit according to an embodiment of the present invention.

FIG. 1 is a diagram illustrating the entire configuration of a switching power supply circuit 60 arranged to drive an LED 70 according to an embodiment of the present invention. The switching power supply circuit 60 is a DC/DC converter including a semiconductor device 50 and an output stage 55.

The output stage 55 disposed outside of the semiconductor device 50 includes a switching element Q1, a switching element Q2, a diode D1, a diode D2, a coil L1, a bootstrap capacitor Cb, an output capacitor C1, a resistor R1, and a resistor R2. The semiconductor device 50 functions as a switching driver IC arranged to switching-drive the switching elements Q1 and Q2. Note that the semiconductor device 50 can be also understood as an LED driver IC (light emitting element driving device).

The semiconductor device 50 includes a logic unit 1, an internal power supply voltage generation unit 2, an under voltage lock out (UVLO) unit 3, a discharge circuit 4, an overvoltage detection unit 5, a driver control unit 6, an oscillator 7, a slope voltage generation unit 8, a comparator 9, a comparator 10, an error amplifier 11, a switch 12, a switch 13, an inverter 14, a dimming control unit 15, a duty setting unit 16, and a constant current control circuit 17. These structural elements are integrated. In addition, the semiconductor device 50 has external terminals T1 to T10 arranged to establish electrical connection with outside.

The drain of the switching element Q1 constituted of an n-channel MOSFET is applied with an input voltage Vin, and the source thereof is connected to the cathode of the diode D1. The anode of the diode D1 is connected to an application terminal of a ground potential. The gate of the switching element Q1 is connected to the external terminal T2 of the semiconductor device 50.

The connection node between the switching element Q1 and the diode D1 is connected to one terminal of the coil L1, and the other terminal of the coil L1 is commonly connected to the anode of the diode D2 and the drain of the switching element Q2 constituted of an n-channel MOSFET. The source of the switching element Q2 is connected to the application terminal of the ground potential. The gate of the switching element Q2 is connected to the external terminal T3 of the semiconductor device 50. The cathode of the diode D2 is connected to one terminal of the output capacitor C1, and the other terminal of the output capacitor C1 is connected to the application terminal of the ground potential.

In addition, the connection node between the switching element Q1 and the coil L1 is connected to one terminal of the bootstrap capacitor Cb. The other terminal of the bootstrap capacitor Cb is connected to the external terminal T1 of the semiconductor device 50.

An output voltage Vout is generated at the connection node between the cathode of the diode D2 and one terminal of the output capacitor C1. The resistor R1 and the resistor R2 for voltage division are connected in series between the connection node and the application terminal of the ground potential. A connection node P1 between the resistor R1 and the resistor R2 is connected to the external terminal T4 of the semiconductor device 50. In addition, the connection node between the cathode of the diode D2 and one terminal of the output capacitor C1 is connected to an anode side of the LED 70. The cathode side of the LED 70 is connected to the external terminal T5 of the semiconductor device 50.

The connection node P1 between the resistor R1 and the resistor R2 is connected to a first inverting input terminal (−) of the error amplifier 11 via the external terminal T4 and the switch 12. The cathode side of the LED 70 is connected to a second inverting input terminal (−) of the error amplifier 11 via the external terminal T5 and the switch 13. The non-inverting input terminal (+) of the error amplifier 11 is applied with a first reference voltage Vref1.

The switch 12 is switched to on or off by a first switching signal SW1 sent from the logic unit 1. The switch 13 is switched to on or off by a logically inverted signal of the first switching signal SW1 from the inverter 14. In other words, depending on a logical level of the first switching signal SW1, the switch 12 is turned on while the switch 13 is turned off, or the switch 12 is turned off while the switch 13 is turned on.

The error amplifier 11 amplifies a difference between the reference voltage Vref1 and one of a cathode voltage Vc of the LED 70 and a divided voltage Vdv1 after dividing the output voltage Vout by the resistor R1 and the resistor R2, so as to output an error voltage ERR. The error voltage ERR is input to the inverting input terminal (−) of the comparator 9.

The slope voltage generation unit 8 generates a sawtooth or triangular slope voltage SL in synchronization with a clock signal output from the oscillator 7. The slope voltage SL is input to the non-inverting input terminal (+) of the comparator 9. The comparator 9 compares the error voltage ERR with the slope voltage SL so as to output a result of the comparison as a comparison signal SC to the driver control unit 6.

On the basis of the comparison signal SC, the driver control unit 6 generates a pulse-like pulse width modulation (PWM) signal Spwm1 or Spwm2 having an adjusted duty and outputs the same to a driver Dr1 or Dr2.

The driver Dr1 outputs a gate signal G1 to the gate of the switching element Q1 via the external terminal T2 so as to turn on the switching element Q1, the gate signal G1 having a voltage obtained by adding the input voltage Vin to a voltage generated in the bootstrap capacitor Cb when being charged by an internal power supply voltage Vreg (i.e., the internal power supply voltage Vreg minus the forward voltage of the diode Db). In addition, the driver Dr1 output the gate signal G1 having the ground potential to the gate of the switching element Q1 so as to turn off the switching element Q1. The driver Dr1 outputs the gate signal G1 in accordance with the PWM signal Spwm1 from the driver control unit 6 so as to switching-drive the switching element Q1.

The driver Dr2 outputs a gate signal G2 having the internal power supply voltage Vreg or the ground potential to the gate of the switching element Q2 via the external terminal T3 so as to turn on or off the switching element Q2. The driver Dr2 outputs the gate signal G2 so as to switching-drive the switching element Q2 in accordance with the PWM signal Spwm2 from the driver control unit 6.

Here, when the switching element Q2 is maintained in the off state by the driver Dr2 while the switching element Q1 is on-off controlled by the driver Dr1, the input voltage Vin is stepped down so as to output the output voltage Vout as a step down mode. On the other hand, when the switching element Q1 is maintained at on state by the driver Dr1 while the switching element Q2 is on-off controlled by the driver Dr2, the input voltage Vin is stepped up so as to output the output voltage Vout as a step up mode. These modes are selectively used in accordance with the number of steps of the LED element or the input voltage Vin depending on application.

When the switch 12 is turned on while the switch 13 is turned off by the first switching signal SW1, the divided voltage Vdv1 after dividing the output voltage Vout by the resistors R1 and R2 is input to the error amplifier 11. Therefore, a feedback control is performed with the divided voltage Vdv1 as a feedback signal, duty of the PWM signal Spwm1 or Spwm2 is adjusted by a PWM control, and the output voltage Vout is controlled to be constant (first feedback control mode).

On the other hand, when the switch 12 is turned off while the switch 13 is turned on by the first switching signal SW1, the cathode voltage Vc of the LED 70 is input to the error amplifier 11. Therefore, a feedback control is performed with the cathode voltage Vc as the feedback signal, duty of the PWM signal Spwm1 or Spwm2 is adjusted by the PWM control, and the cathode voltage Vc is controlled to be constant (second feedback control mode).

The constant current control circuit 17 is a MOS transistor 171, a resistor 172, an error amplifier 173, a switch 174, a switch 175, an inverter 176, and a switch 177. The external terminal T5, to which the cathode side of the LED 70 is connected, is connected to the drain of the MOS transistor 171 constituted of the n-channel MOSFET. The source of the MOS transistor 171 is connected to one terminal of the resistor 172. The other terminal of the resistor 172 is connected to the application terminal of the ground potential. The connection node between the MOS transistor 171 and the resistor 172 is connected to the inverting input terminal (−) of the error amplifier 173 via the switch 175. The non-inverting input terminal (+) of the error amplifier 173 is applied with a second reference voltage Vref2. The output terminal of the error amplifier 173 is connected to the gate of the MOS transistor 171 via the switch 174. The connection node between the switch 174 and the MOS transistor 171 is connected to the application terminal of the ground potential via the switch 177.

The switch 174 and the switch 175 are switched to on or off by the second switching signal SW2 sent from the logic unit 1. The switch 177 is switched to on or off by a logically inverted signal of a second switching signal SW2 from the inverter 176. In other words, on the basis of a logical level of the second switching signal SW2, the switches 174 and 175 are turned on while the switch 177 is turned off, or the switches 174 and 175 are turned off while the switch 177 is turned on.

When the switches 174 and 175 are turned on while the switch 177 is turned off by the second switching signal SW2, the error amplifier 173 is supplied with a current detection signal having a voltage obtained by converting current IL flowing in the LED 70 and the MOS transistor 171 by the resistor 172. Then, the error amplifier 173 outputs to the MOS transistor 171 a signal obtained by amplifying a difference between the current detection signal and the second reference voltage Vref2, so as to drive and control the MOS transistor 171. In this way, the constant current control is performed so as to maintain the constant current IL.

On the other hand, when the switches 174 and 175 are turned off while the switch 177 is turned on by the second switching signal SW2, the gate of the MOS transistor 171 is short-circuited to the ground potential, and hence the MOS transistor 171 is maintained to be turned off. In this way, the current IL is cut off.

In addition, a dimming signal DM as the PWM signal (pulse signal) having adjusted duty is externally input to the dimming control unit 15 via the external terminal T7. The dimming control unit 15 generates a dimming control signal DCR based on the dimming signal DM and outputs the same to the logic unit 1. The dimming brightness can be adjusted by the duty of the dimming signal DM.

The duty setting unit 16 generates a duty set signal DS in accordance with a capacitance of a not-shown capacitor externally connected to the external terminal T8 and outputs the same to the logic unit 1. The duty set signal DS indicates a duty threshold value of the dimming signal DM.

The logic unit 1 compares the duty of the dimming signal DM and the set threshold value based on the dimming control signal DCR and the duty set signal DS, and switches between the first feedback control mode and the second feedback control mode described above based on a result of the comparison.

When it is determined that the dimming signal DM has a duty of the threshold value or more, the logic unit 1 turns off the switch 12 while turns on the switch 13 by the first switching signal SW1, so as to enable the second feedback control mode to maintain the cathode voltage Vc at a constant value. An example of various signal waveforms is shown in FIG. 2.

Figure 2:
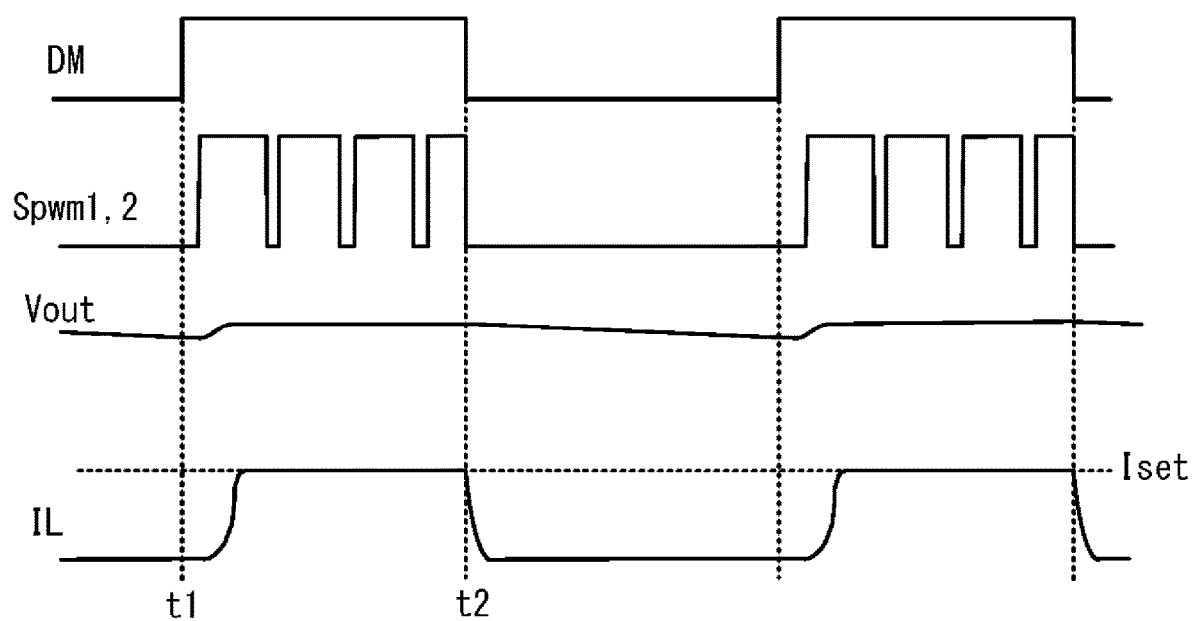
FIG. 2 is a timing chart illustrating an operation of the switching power supply circuit according to an embodiment of the present invention (in a high dimming ratio mode).

As illustrated in FIG. 2, when the dimming signal DM rises to High level at timing t1, the logic unit 1 turns on the switches 174 and 175 while turns off the switch 177 by the second switching signal SW2. In this way, the current IL rises to a set current Iset. In this case, the forward voltage generated in the LED 70 is increased. Therefore, if the output voltage Vout is approximately 30 V, for example, the cathode voltage Vc becomes approximately 1 V. If the first reference voltage Vref1 is 1 V, the PWM signal Spwm1 or Spwm2 is generated so that the cathode voltage Vc becomes constant at 1 V. In this way, the switching element Q1 or Q2 is on-off controlled.

Further, in the period while the current IL is controlled to be constant at the set current Iset, if the dimming signal DM falls at timing t2, the logic unit 1 turns off the switches 174 and 175 while turns on the switch 177 by the second switching signal SW2, and hence the current IL is decreased to zero. In this case, the forward voltage generated in the LED 70 is decreased, and the cathode voltage Vc is increased to approximately 10 V in the above example. Therefore, the cathode voltage Vc becomes considerably higher than 1 V as the first reference voltage Vref1, the PWM signal Spwm1 or Spwm2 is maintained at Low level, and the switching element Q1 or Q2 is maintained in the off state.

By repeating this operation, brightness of the LED 70 can be adjusted while suppressing a switching loss.

On the other hand, when it is determined that duty of the dimming signal DM is lower than the threshold value, the logic unit 1 enables the first feedback control mode in which the switch 12 is turned on while the switch 13 is turned off by the first switching signal SW1 so that the output voltage Vout is maintained at a constant value. An example of various signal waveforms in this case is illustrated in FIG. 3.

Figure 3:
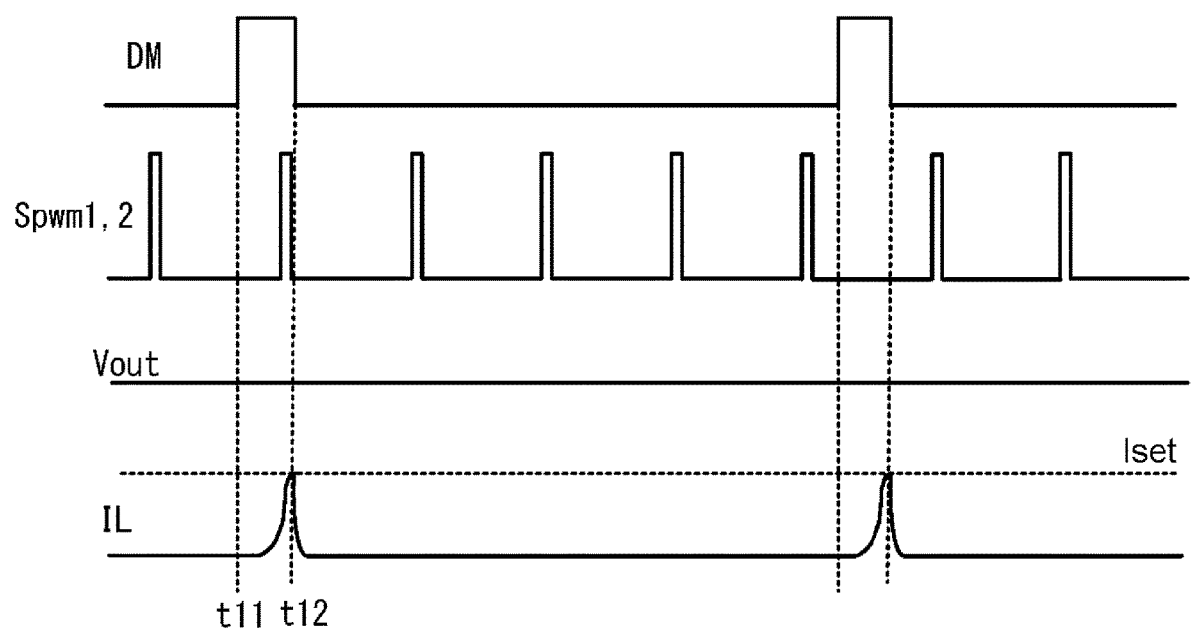
FIG. 3 is a timing chart illustrating an operation of the switching power supply circuit according to an embodiment of the present invention (in a low dimming ratio mode).

As illustrated in FIG. 3, at timing t11 when the dimming signal DM rises, the logic unit 1 turns on the switches 174 and 175 while turns off the switch 177 by the second switching signal SW2, and the current IL rises to the set current Iset. Then, in the period while the current IL is controlled to be constant at the set current Iset, when the dimming signal DM falls at timing t12, the logic unit 1 turns off the switches 174 and 175 while turns on the switch 177 by the second switching signal SW2, and the current IL is decreased to zero. By repeating this operation, dark brightness of the LED 70 can be adjusted.

In this case, because the first feedback control mode is enabled, without depending on a level of the dimming signal DM (on or off of the current IL), the PWM signal Spwm1 or Spwm2 is always generated so that the output voltage Vout becomes constant. When duty of the dimming signal DM is low, if the second feedback control mode is enabled, the PWM signal Spwm1 or Spwm2 is generated only in a short period while the dimming signal DM is High level, and hence the output voltage Vout cannot be maintained at a predetermined level. Therefore, if the dimming signal DM has a low duty, the first feedback control mode is enabled so that the output voltage Vout can be maintained at a predetermined level.

In addition, the internal power supply voltage generation unit 2 is externally supplied with the input voltage Vin via the external terminal T9, and generates the internal power supply voltage Vreg based on the input voltage Vin. The internal power supply voltage Vreg is supplied to individual portions including the logic unit 1.

When an enable signal EN indicating enabled is input to the internal power supply voltage generation unit 2 from outside via the external terminal T6, the internal power supply voltage generation unit 2 raises the internal power supply voltage Vreg. Until the internal power supply voltage Vreg reaches a predetermined UVLO cancel voltage, a UVLO unit 3 maintains the logic unit 1 at a standby state. Further, when the internal power supply voltage Vreg reaches the UVLO cancel voltage, the UVLO unit 3 cancels the standby state of the logic unit 1. In this way, the semiconductor device 50 is activated.

When the enable signal EN indicating disabled is input to the internal power supply voltage generation unit 2, the internal power supply voltage generation unit 2 decreases the internal power supply voltage Vreg. When the internal power supply voltage Vreg becomes lower than a predetermined UVLO detection voltage, the UVLO unit 3 sets the logic unit 1 to the standby state. In this way, the switching elements Q1 and Q2 is maintained in the off state, and the semiconductor device 50 becomes a power off state.

<Overvoltage Protection Structure>

Figure 4:
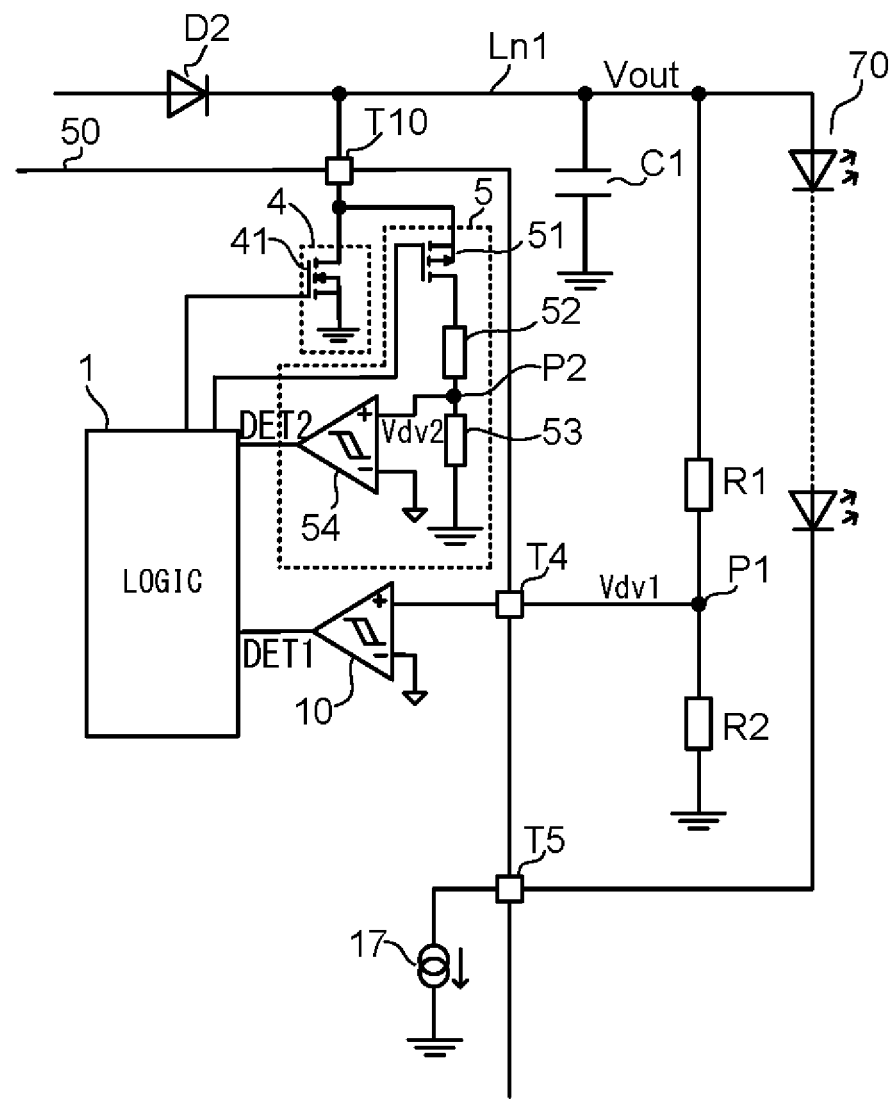
FIG. 4 is a diagram illustrating an overvoltage detection configuration according to an embodiment of the present invention.

Next, a structure including the discharge circuit 4, the overvoltage detection unit 5, and the comparator 10 is described in detail with reference to FIG. 4. FIG. 4 is a diagram illustrating a specific structural example of the discharge circuit 4 and the overvoltage detection unit 5.

The discharge circuit 4 includes a MOS transistor 41 constituted of an n-channel MOSFET. The drain of the MOS transistor 41 is connected to a line Ln1 via the external terminal T10, the line Ln1 being connected to one terminal of the output capacitor C1 and generating the output voltage Vout. The source of the MOS transistor 41 is connected to the application terminal of the ground potential. The logic unit 1 supplies a gate signal to the gate of the MOS transistor 41, so as to switch on/off of the MOS transistor 41.

When the logic unit 1 becomes the standby state by the UVLO unit 3 so that the semiconductor device 50 becomes the power off state, the logic unit 1 turns on the MOS transistor 41. In this way, charge is drawn from the output capacitor C1 via the external terminal T10 and the MOS transistor 41, and hence the output capacitor C1 is discharged. In this way, the output voltage Vout is securely 0 V. Note that the MOS transistor 41 is maintained at the off state after the semiconductor device 50 is activated.

In addition, the connection node P1 between the resistor R1 and the resistor R2 is connected to the non-inverting input terminal (+) of the comparator 10 inside the semiconductor device 50 via the external terminal T4. The comparator 10 is constituted of a hysteresis comparator, and compares the divided voltage Vdv1 generated at the connection node P1 with a first threshold value voltage or a second threshold value voltage (lower than the first threshold value voltage), so as to output a result of the comparison as a detection signal DET1 to the logic unit 1.

When the output voltage Vout becomes higher than a first overvoltage set value determined by the first threshold value voltage and resistance values of the resistors R1 and R2, the comparator 10 outputs the detection signal DET1 having High level. In other words, the comparator 10 functions as the overvoltage detection unit.

The overvoltage detection unit 5 includes a MOS transistor 51 (switch) constituted of a p-channel MOSFET, a resistor 52, a resistor 53, and a comparator 54. The source of the MOS transistor 51 is connected to the line Ln1 via the external terminal T10. The resistor 52 and the resistor 53 are connected in series between the drain of the MOS transistor 51 and the application terminal of the ground potential. A connection node P2 between the resistor 52 and the resistor 53 is connected to the non-inverting input terminal (+) of the comparator 54. The logic unit 1 supplies a gate signal to the gate of the MOS transistor 51 so as to switch on/off of the MOS transistor 51.

After the semiconductor device 50 is activated, the MOS transistor 51 is turned on. In addition, when the semiconductor device 50 becomes the power off state, the MOS transistor 51 is turned off. In this way, it is possible to prevent flowing of leak current from the line Ln1 via the MOS transistor 51 in the power off state.

When the MOS transistor 51 is turned on, a divided voltage Vdv2 obtained by dividing the output voltage Vout by the resistor 52 and the resistor 53 is generated at the connection node P2. The comparator 54 is constituted of a hysteresis comparator, the divided voltage Vdv2 is compared with a third threshold value voltage or a fourth threshold value voltage (lower than the third threshold value voltage), so as to output a result of the comparison as a detection signal DET2 to the logic unit 1.

When the output voltage Vout becomes higher than a second overvoltage set value determined by the third threshold value voltage and resistance values of the resistors 52 and 53, the comparator 54 outputs the detection signal DET2 having High level. In other words, the second overvoltage set value is set to a value that is lower than a withstand voltage of the semiconductor device 50 and is quite close to the withstand voltage. The first overvoltage set value is set to a value equal to or lower than a predetermined overvoltage set value upper limit lower than the second overvoltage set value. For example, the second overvoltage set value is set to 45 V, and the first overvoltage set value is set to a value equal to or lower than 40 V that is the overvoltage set value upper limit. In this case, the first overvoltage set value is set to 30 V or 25 V or other voltage according to application of the semiconductor device 50.

In the case where the resistors R1 and R2 as external resistors are in normal state, when the output voltage Vout reaches the first overvoltage set value before reaching the second overvoltage set value, the comparator 10 outputs the detection signal DET1 of High level so that the overvoltage is detected. When receiving this signal, the logic unit 1 controls to turn off the switching elements Q1 and Q2 so that overvoltage protection is performed. When the output voltage Vout falls so that the divided voltage Vdv1 becomes lower than the second threshold value voltage, the comparator 10 outputs the detection signal DET1 of Low level to the logic unit 1. When receiving this signal, the logic unit 1 controls to restart the switching control of the switching element Q1 or Q2.

On the other hand, if an abnormality, such as disconnection of the resistor R1 or setting error of resistance values of the resistors R1 and R2, has occurred in the resistors R1 and R2, even if the output voltage Vout reaches the first overvoltage set value, the divided voltage Vdv1 does not reach the first threshold value voltage, and the comparator 10 cannot detect overvoltage. However, even in this case, when the output voltage Vout reaches the second overvoltage set value, the divided voltage Vdv2 reaches the third threshold value voltage. Therefore, the comparator 54 outputs the detection signal DET2 of High level, and overvoltage can be detected. When receiving this signal, the logic unit 1 controls to turn off the switching elements Q1 and Q2 so that overvoltage protection is performed. When the output voltage Vout falls so that the divided voltage Vdv2 becomes lower than the fourth threshold value voltage, the comparator 54 outputs the detection signal DET2 of Low level to the logic unit 1. When receiving this signal, the logic unit 1 controls to restart the switching control of the switching element Q1 or Q2.

In this way, in this embodiment, by duplicating the overvoltage detection configuration, even if an abnormality occurs in the external resistors R1 and R2, it is possible to prevent the semiconductor device 50 from being broken when the output voltage Vout becomes higher than the withstand voltage of the semiconductor device 50. In particular, the resistors 52 and 53 included in the overvoltage detection unit 5 is configured inside the semiconductor device 50, there is almost no possibility of occurrence of abnormality such as disconnection or setting error of resistance values, unlike the external resistors R1 and R2.

In addition, the configuration of FIG. 4 also has an effect that there is no need to add an external terminal, because the external terminal T10 used for the discharge circuit 4 is also used for the overvoltage detection unit 5.

Figure 5:
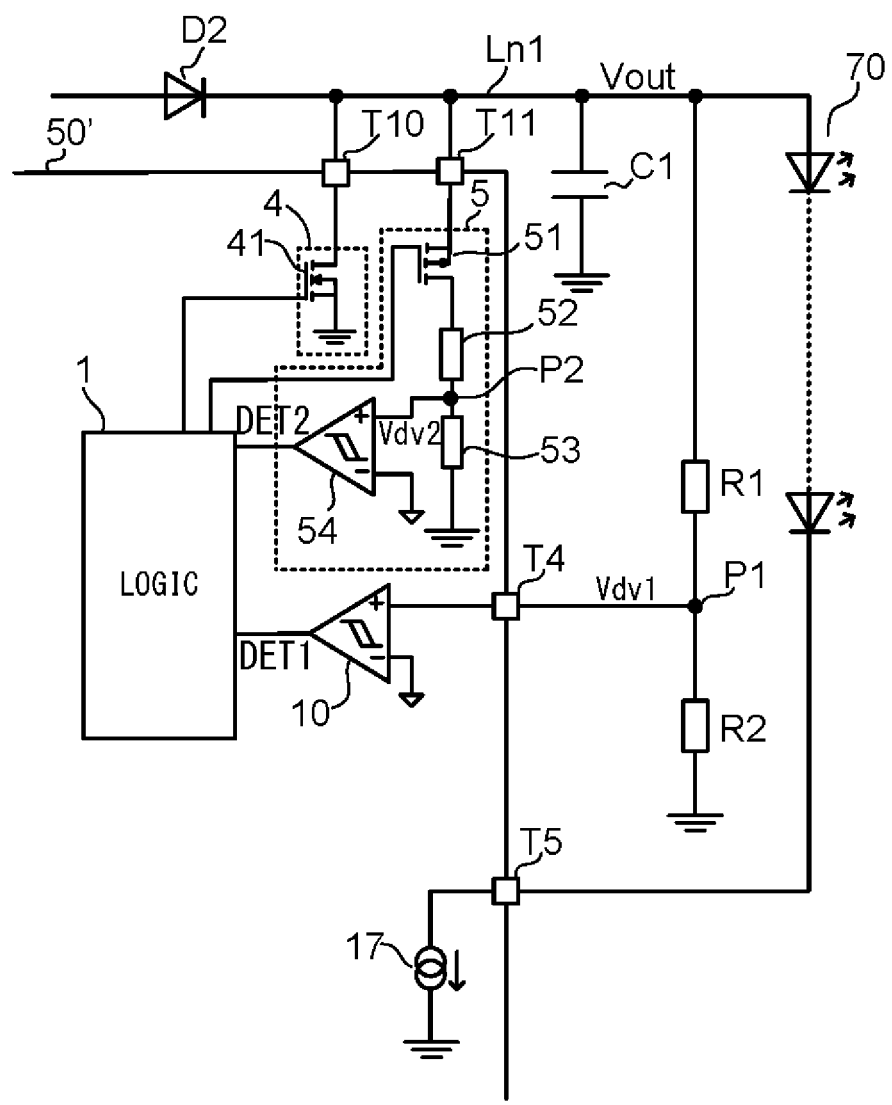
FIG. 5 is a diagram illustrating an overvoltage detection configuration according to another embodiment.

Note that concerning the effect of duplicating the overvoltage detection configuration, it is also possible to adopt a modified structural example illustrated in FIG. 5, in which an external terminal T11 for dedicated use for the overvoltage detection unit 5 is additionally provided independent of the external terminal T10, so that the output voltage Vout is received via the external terminal T11.

<Application to Liquid Crystal Display Device (LCD)>

Figure 6:
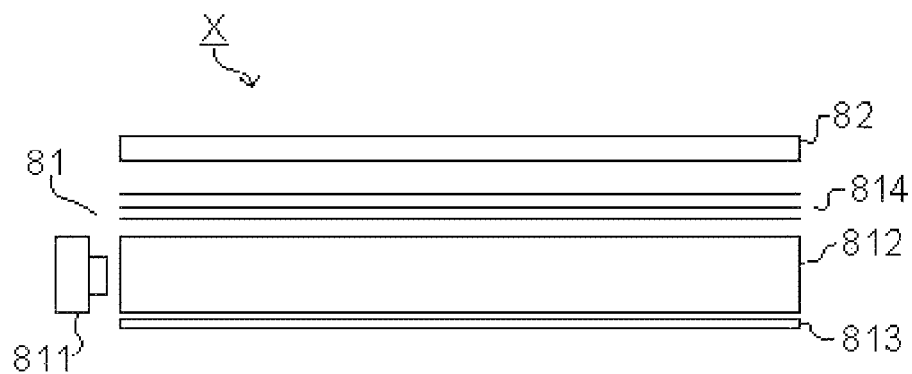
FIG. 6 is a side view illustrating a schematic structure of a liquid crystal display device according to an embodiment of the present invention.

As an example of an application of the semiconductor device (switching power supply circuit) of the embodiment described above, a liquid crystal display device is described. A structural example of the liquid crystal display device is illustrated in FIG. 6. Note that the structure illustrated in FIG. 6 is a so-called edge light type, but without limiting to this, a direct type may be adopted.

A liquid crystal display device X illustrated in FIG. 6 includes a backlight 81, and a liquid crystal panel 82. The backlight 81 is an illumination device (an example of a light emission device) that illuminates the liquid crystal panel 82 from backside. The backlight 81 includes an LED light source unit 811, a light guide plate 812, a reflecting plate 813, and optical sheets 814.

The LED light source unit 811 includes an LED and a substrate on which the LED is mounted. As a switching power supply circuit for use of driving the LED, the one according to the embodiment described above can be used. Light emitted from the LED light source unit 811 enters the light guide plate 812 from its side face. The light guide plate 812 made of an acrylic plate for example guides the entering light in the entire inside by total reflection, and outputs planar light from the surface on the side where the optical sheets 814 is disposed. The reflecting plate 813 reflects light leaking from the light guide plate 812 to the inside of the light guide plate 812. The optical sheets 814 includes a diffusion sheet, a lens sheet, and the like, for purposes of uniformizing and improving luminance of light illuminating the liquid crystal panel 82.

<In-Vehicle Display>

The liquid crystal display device using the semiconductor device according to the embodiment described above is appropriately used for in-vehicle displays in particular. The technique for securely performing the overvoltage protection described above is laid down in ISO26262 that is an international standard concerning electric/electronic functional safety of a vehicle, and in this situation it is important in view of security.

Figure 7:
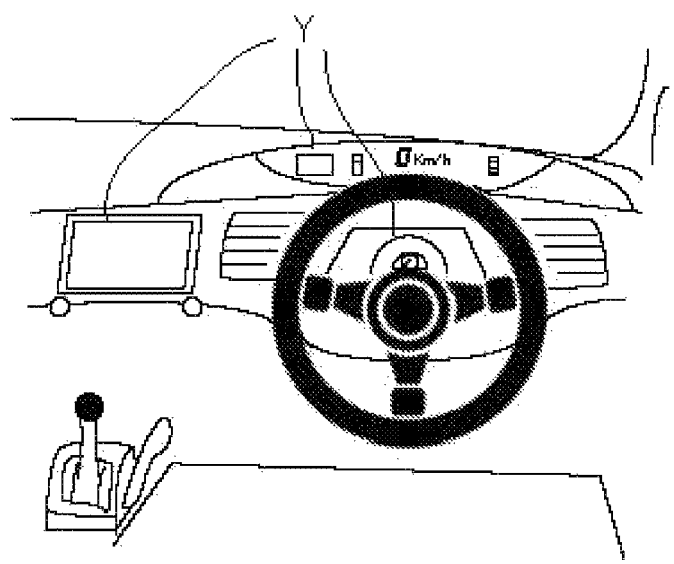
FIG. 7 is a diagram illustrating a manner in which in-vehicle displays according to an embodiment of the present invention are mounted in a vehicle.

The in-vehicle display is disposed in a dashboard in front of a driver's seat like the in-vehicle displays Y illustrated in FIG. 7, for example. The in-vehicle display Y can display various images such as car navigation information, a picked-up image of the rear of the vehicle, a speed meter, a tachometer, a fuel meter, a fuel economy meter, a shift position, and the like, so as to provide the user with various information.

<Others>

Note that the embodiment described above is merely an example in every aspect and should not be interpreted as a limitation. The technical scope of the present invention is defined not by the above description of the embodiment but by the claims and should be understood to include all modifications within meanings and scopes equivalent to the claims.

What is claimed is:

1. A semiconductor device comprising:
a first overvoltage detection unit including a first comparator arranged to output a first detection signal based on a first divided voltage after dividing an output voltage of a power supply circuit by first resistors disposed externally;
a second overvoltage detection unit including second resistors and a second comparator arranged to output a second detection signal based on a second divided voltage after dividing the output voltage by the second resistors;
an external terminal connected to an output capacitor disposed in the power supply circuit; and
a discharge circuit arranged to discharge the output capacitor via the external terminal,
wherein the second resistors are connected to the external terminal.

2. The semiconductor device according to claim 1, further comprising a logic unit arranged to operate in accordance with the first detection signal and the second detection signal, wherein
the logic unit turns off a switching element of the power supply circuit when one of the first detection signal and the second detection signal is detected, so as to perform overvoltage protection.

3. A semiconductor device comprising:
a first overvoltage detection unit including a first comparator arranged to output a first detection signal based on a first divided voltage after dividing an output voltage of a power supply circuit by first resistors disposed externally;
a second overvoltage detection unit including second resistors and a second comparator arranged to output a second detection signal based on a second divided voltage after dividing the output voltage by the second resistors;
a first external terminal connected to an output capacitor disposed in the power supply circuit;
a discharge circuit arranged to discharge the output capacitor via the first external terminal; and
a second external terminal connected to the output capacitor, wherein
the second resistors are connected to the second external terminal.

4. The semiconductor device according to claim 1, wherein the discharge circuit is constituted of a MOS transistor.

5. The semiconductor device according to claim 3, wherein the discharge circuit is constituted of a MOS transistor.

6. The semiconductor device according to claim 1, wherein the second overvoltage detection unit further includes a switch arranged to switch connection and disconnection of a path between a line generating the output voltage and the second resistors.

7. The semiconductor device according to claim 1, wherein the second comparator is constituted of a hysteresis comparator.

8. The semiconductor device according to claim 1, wherein overvoltage set value of the first overvoltage detection unit is lower than overvoltage set value of the second overvoltage detection unit.

9. The semiconductor device according to claim 1, wherein the power supply circuit drives a light emitting element as a load.

10. A power supply circuit comprising:
the semiconductor device according to claim 1; and
the first resistors.

11. A light emission device comprising:
the power supply circuit according to claim 10; and
the light emitting element driven by the power supply circuit.

12. A display device comprising the light emission device according to claim 11.

13. The display device according to claim 12 as an in-vehicle device.

14. The semiconductor device according to claim 9, wherein:
the power supply circuit is a switching power supply circuit,
the load is a light-emitting diode (LED),
the semiconductor device comprises a first feedback control mode in which an output voltage of the power supply circuit is controlled to be constant, a second feedback control mode in which a voltage on a cathode side of the LED is controlled to be constant and a constant current control circuit which turns on and off a current flowing through the LED according to a dimming signal in a shape of a pulse, and
the semiconductor device further comprises a switching unit which switches, according to a duty of the dimming signal, between the first feedback control mode and the second feedback control mode and a duty setting unit which sets such a threshold value of the duty as to perform the switching with the switching unit.

* * * * *